(12) United States Patent
Ives et al.

(10) Patent No.: US 6,421,243 B1
(45) Date of Patent: Jul. 16, 2002

(54) SIGNAL AND POWER ROUTING APPARATUS AND METHODS

(75) Inventors: Thomas W Ives, Boise; Darrel Poulter, Middleton, both of ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/687,366

(22) Filed: Oct. 13, 2000

(51) Int. Cl.$^7$ ................................................ H05K 7/20
(52) U.S. Cl. ...................... 361/725; 361/724; 361/727; 312/223.1; 439/155
(58) Field of Search ............................... 361/725, 683, 361/685, 686, 724–727; 312/223.1, 223.2, 223.3; 364/708.1; 439/155–160

(56) References Cited

U.S. PATENT DOCUMENTS

| | | | | |
|---|---|---|---|---|
| 5,381,315 A | * | 1/1995 | Hamaguchi et al. | ........ 361/727 |
| 6,052,278 A | * | 4/2000 | Tanzer et al. | ............... 361/685 |
| 6,061,244 A | * | 5/2000 | O'Sullivan et al. | .......... 361/727 |
| 6,108,198 A | * | 8/2000 | Lin | .............................. 361/683 |

* cited by examiner

Primary Examiner—Darren Schuberg
Assistant Examiner—Hung Van Duong

(57) ABSTRACT

The invention includes a support structure which is configured to removably support at least one module which is a sub-component of a larger unit of equipment. The support structure also removably supports at least one plane which is configured to provide signal and/or power routing to the module. The support structure can be configured to removably support at least two planes which provide redundant electrical routing to the module or modules. The support structure can be configured so that multiple modules and the plane can be installed onto, and removed from, the support structure in any sequence. The support structure can also have at least one access face through which at least one plane and a plurality of modules can be placed onto, or removed from, the support structure in any sequence. The invention also includes a method of providing signal and/or power routing to various modules of a unit of equipment, which method includes providing redundant routing to the modules.

18 Claims, 8 Drawing Sheets

SIGNAL AND POWER ROUTING APPARATUS AND METHODS

FIELD OF THE INVENTION

This invention pertains to methods and apparatus for routing signals and power in a device having removable components.

BACKGROUND OF THE INVENTION

This invention pertains to methods and apparatus for providing routing of signals and power in a device. The methods and apparatus provide for convenient removal and replacement of various components which make up the device. The invention includes methods and apparatus for providing redundant signal and power routing between the various components.

Often, prior art equipment is comprised of various components which are supported on a common structural support such as a chassis, or frame, or the like. For example, a large prior art computer unit is often comprised of various modular sub-components. These modular sub-components, or modules, can be one of any number of different devices. For example, in a unit of electrical equipment such as a computer, or the like, these modular components can include disk drives, controllers, power supplies, or cooling fans, etc. Generally, routing paths are provided to the modules so that signals and power can be routed, or distributed, to the various modules from other devices and between the modules themselves. These routing paths can be in many forms, including electrical, fiber-optic, pneumatic, and hydraulic. For illustrative purposes, the primary form of routing discussed herein will be that of electrical routing, although it is understood that the principles set forth can be applied to any form of signal and power routing.

In prior art configurations for electronic equipment, for example, the electrical routing to the modules, which are included in the equipment, is often achieved through the use of printed circuit boards, or printed circuit assemblies, which can be referred to as "planes." These planes are typically configured as flat boards with integral electrical circuits which are configured to provide electrical routing to the modules. From the standpoint of the end-user of such electronic equipment, a highly desirable feature is the reliable operation of the equipment with minimum down-time. To this end, the modules are often configured so that each is easily removable from the unit. The easily removable nature of each of the modules facilitates the replacement of a failed or malfunctioning module which, in turn, helps to decrease the down-time of the equipment.

FIGS. 1, 2, and 3 illustrate the configuration of a typical prior art unit of electronic equipment. FIG. 1 is an exploded perspective view of a prior art unit 10. As shown in FIG. 1, a prior art unit 10 can include a front chassis 12 and a rear chassis 14. The unit 10 also includes a plane 16. As can be seen from FIG. 1, the front and rear chassis 12, 14 and the plane 16 are configured to be supported within a shroud 18. As is further revealed by FIG. 1, the plane 16 is configured to be located within the shroud 18 and between the front and rear chassis 12, 14. The shroud 18 can serve both as an enclosure and a structural support for the front and rear chassis 12, 14 and the plane 16.

FIG. 2 is another exploded view of the prior art unit 10. As shown in FIG. 2, the front chassis 12 is installed within the shroud 18. Likewise, the rear chassis 14 has been installed within the shroud, but is not visible in FIG. 2. As further shown in FIG. 2, the prior art unit 10 includes a plurality of modules 20. A portion of the modules 20 are configured to be supported in the front chassis 12 as shown in FIG. 2. The remaining modules 20 are configured to be supported in the rear chassis 14 which is not visible in FIG. 2, but which is shown in FIG. 1. As can be seen from FIG. 2, the modules are configured to be removable from the unit 10.

FIG. 3 is a side view of the prior art unit 10 with a portion of the shroud 18 cutaway to show the interior components thereof. As can be seen in FIG. 3, the plane 16 is fastened in place within the shroud 18 with fasteners 19, or other suitable fastening means. It should be evident from FIG. 3 that the plane 16 is fastened to the shroud 18 between the front and rear chassis 12, 14 which are also fastened in place within the shroud. As also shown in FIG. 3, the modules 20 are located within the shroud 18 and are supported within each of the respective front and rear chassis 12, 14. However, as shown in FIG. 3, a replacement module 21 is shown slightly out of position as it is slid into the front chassis 12.

As previously discussed, the plane 16 provides electrical routing to the various modules 20 when the modules are installed within the respective chassis 12, 14 shown in FIG. 3. In other words, the plane 16 is configured to provide predetermined electrical path, in the form of electrical circuits (not shown), for the transfer of electrical signals and electrical power to the various modules 20. As further shown in FIG. 3, a plurality of first electrical connector portions 25 are supported on the plane 16. The first electrical connector portions 25 form terminals for various legs of the electrical circuits (not shown) which are on the plane 16.

Also, as can be seen in FIG. 3, a second connector portion 26 is supported on each of the modules 20 and the replacement module 21. The first and second electrical connector portions 25, 26 are configured to electrically connect with one another so as to pass electrical signals and electrical power there between as shown in FIG. 3. It is evident that the location of the plane 16 between the front and rear chassis 12, 14 allows the plane to be connected to both the modules which are supported in the front chassis 12 and the modules which are supported in the rear chassis 14. It is also evident from FIG. 3 that the electrical connection between each of the modules 20, 21 and the plane 16 occurs when the modules are fully inserted into the respective front and rear chassis 12, 14. As is further evident from FIG. 3, the modules 20, 21 can be configured so as to be electrically connected to the plane 16 by way of the first and second electrical connector portions 25, 26. Thus, the various modules 20, 21 are configured to be electrically connected to the plane 16 in a predetermined manner by way of the first and second electrical connector portions 25, 26 and the electrical circuits (not shown) which are on the plane. Electrical connectors such as those described above are well known in the art.

Referring now to FIG. 2, the removable configuration of the individual prior art modules 20 from the shroud 18 facilitates the reduction of undesirable down-time of the prior art unit of equipment 10. That is, each of the modules 20 can be relatively easily removed and replaced should such removal and replacement become necessary due to failure or malfunction of a module. It is evident that a failure or malfunction of the plane 16 is also possible. It is equally evident that such failure or malfunction of the plane 16 is also highly undesirable because such failure or malfunction can prevent the passage of electrical signals and power to the various modules 20.

However, as can be seen by a study of FIG. 3, removal and replacement of the plane 16 can be a relatively complex and time consuming task compared to the removal and replacement of a module 20. Specifically, as is evident, the removal of the plane 16 requires the complete removal of the entire front chassis 12 and associated modules 20, 21, or in the alternative, the complete removal of the rear chassis 14 and associated modules 20. Additionally, removal of the plane 16 requires removal of the various fasteners 19 which fasten the plane to the shroud 18. Thus, failure or malfunction of the plane 16 can result in considerable down-time of the prior art unit 10 while the plane is removed and replaced.

What is needed, then, is a method and an apparatus for providing signal and power routing between various components of a unit of equipment, which methods and apparatus increase the reliability of the equipment by providing for ease of replacement of the component parts and by providing redundancy in the routing.

SUMMARY OF THE INVENTION

In accordance with one embodiment of the present invention, an apparatus for removably supporting a plane and a plurality of modules comprises a support structure and an access face defined on the support structure. An access face is defined on the support structure. The modules and the plane can be placed onto, and removed from, the support structure through the access face.

In accordance with another embodiment of the present invention, an apparatus for removably supporting a plurality of modules comprises a support structure and an access face defined on the support structure. The apparatus further comprises a first plane and a second plane which are removably supported on the support structure. The modules and planes can be placed onto, and removed from, the support structure through the access face in any sequence. Either of the planes can be removed from, and replaced onto, the support without effecting the signal and power routing between the modules provided by the other plane.

In accordance with yet another embodiment of the present invention, the invention includes a support structure having a front portion and a rear portion. An access face is defined on each of the front and rear portions. The support structure can be configured to removably support a plurality of modules on each of the front and rear portions. Further, the support structure can be configured to removably support a first plane and a second plane on the front portion and a third plane and a fourth plane on the rear portion.

In accordance with a further embodiment of the present invention, a method includes providing signal and power routing between the various modules of a unit of equipment. The method includes providing redundant signal and power routing between the modules.

DETAILED DESCRIPTION OF THE INVENTION

The invention includes methods and apparatus for providing signal and power routing to various modules of a unit of equipment, and which signal and power routing can be configured to include redundant routing. In accordance with one embodiment of the invention, the invention comprises a support structure configured to support a plurality of modules in a removable manner. The support structure is also configured to support a plane in a removable manner. The plane provides signal and power routing to the modules. The modules and the plane can be placed onto, and removed from, the support structure through an access face on the support structure in any sequence.

In accordance with another embodiment of the invention, the invention comprises a support structure as described in the above embodiment, as well as a first plane and a second plane which are removably supported on the support structure. The first and second planes can be configured to provide redundant signal and power routing to the modules. The modules, and the first and second planes, can be placed onto, or removed from, the support structure in any sequence. Furthermore, the modules, and the first and second planes, can be placed onto, or removed from, the support structure through the access face on the support structure.

In accordance with a further embodiment of the invention, the invention includes a structural support with a front portion and a rear portion. Each portion can be configured to removably support a plurality of modules. Each portion can also be configured to removably support a pair of planes. Furthermore, a front access face is defined on the front portion and a rear access face is defined on the rear portion.

In accordance with yet another embodiment of the invention, the invention comprises a method of providing signal and power routing to various modules which make up a unit of equipment. The method comprises various steps which include providing a support, and placing the modules, and then the plane, into the support such that the plane can provide signal and power routing to the modules. The method can include the additional step of placing a second plane into the support to provide redundant signal and power routing to the modules.

Figure 1:
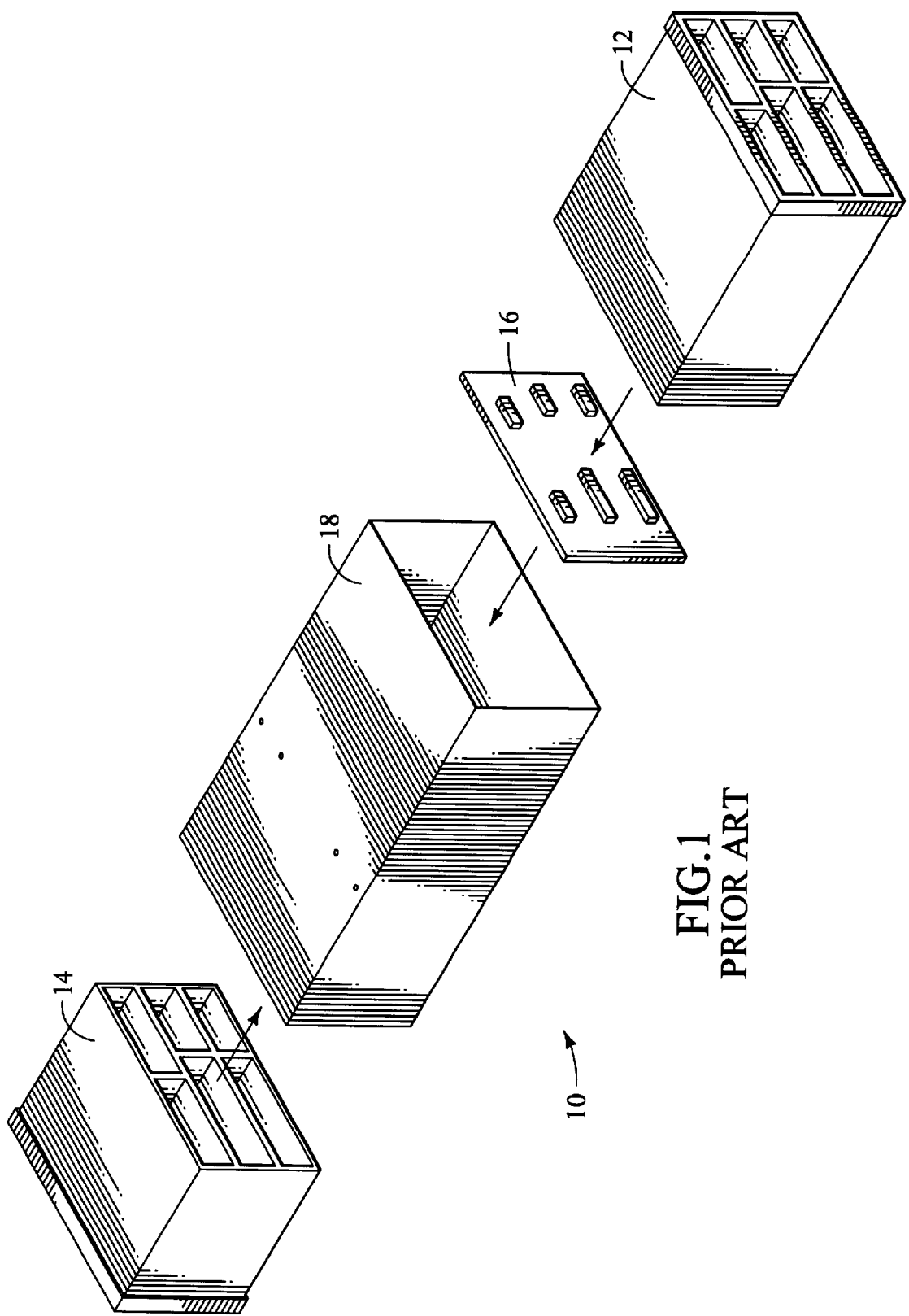
FIG. 1 is a perspective view of a prior art unit of equipment.
Figure 2:
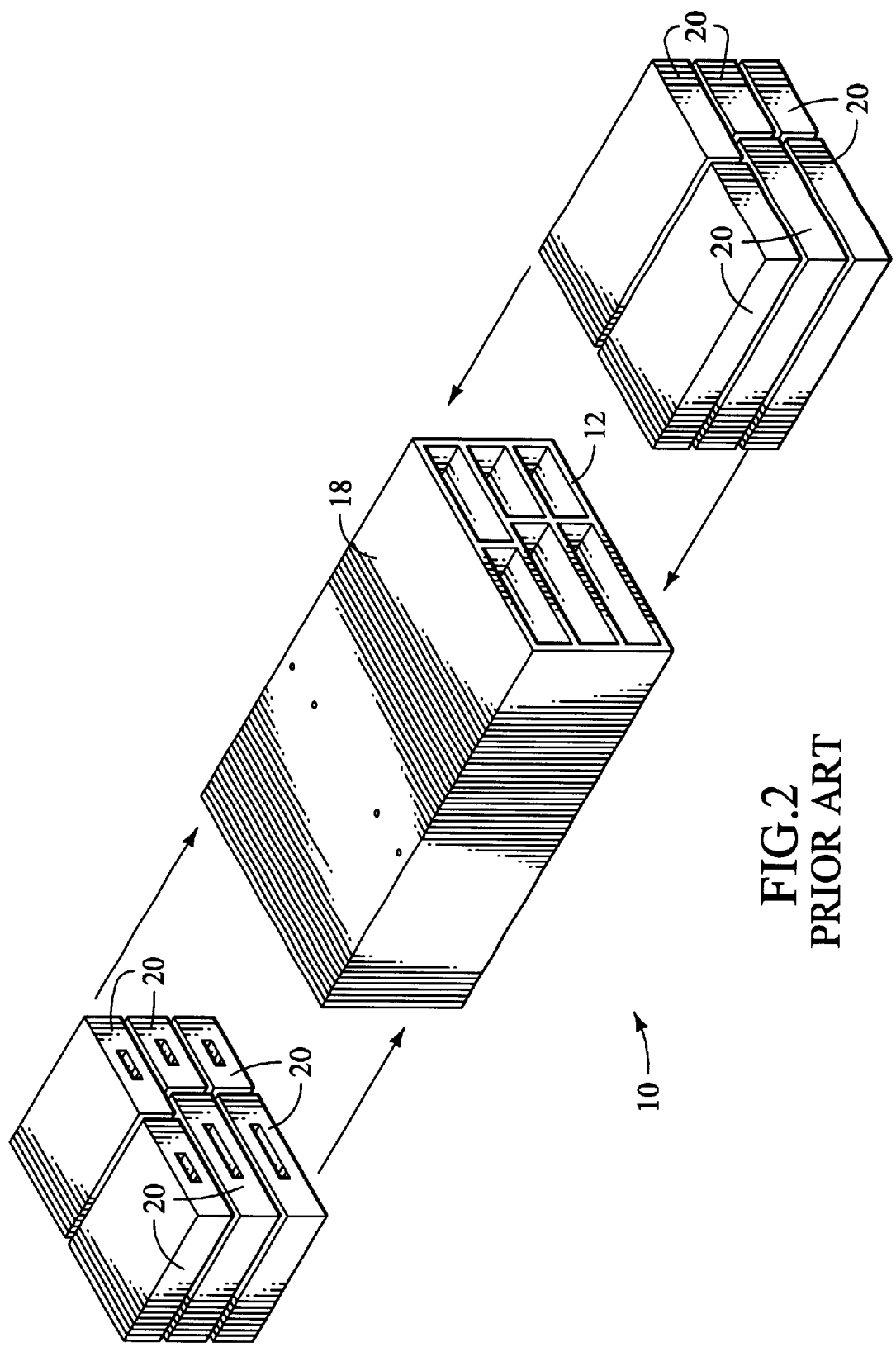
FIG. 2 is another perspective view of the prior art unit of equipment shown in FIG. 1.
Figure 3:
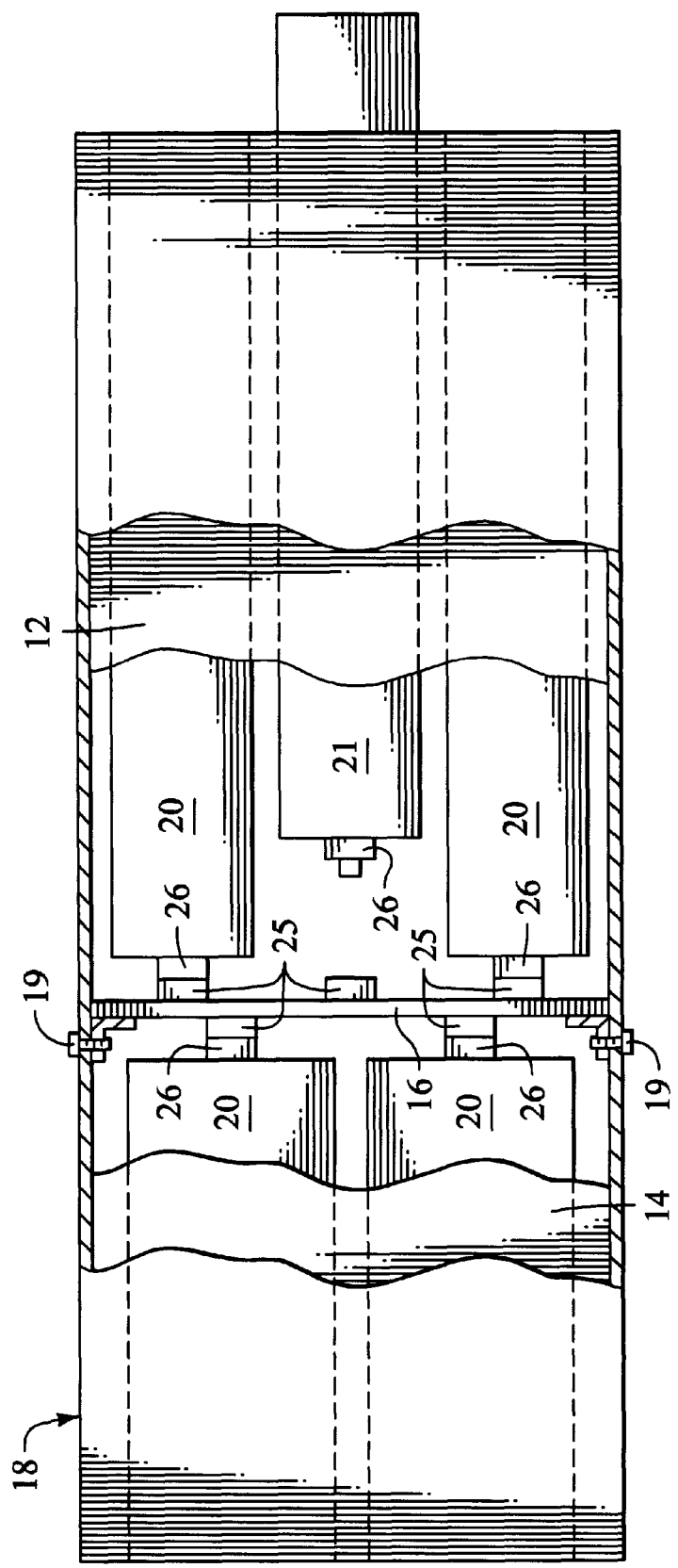
FIG. 3 is a side elevation cutaway view of the prior art unit of equipment shown in FIG. 1.
Figure 4:
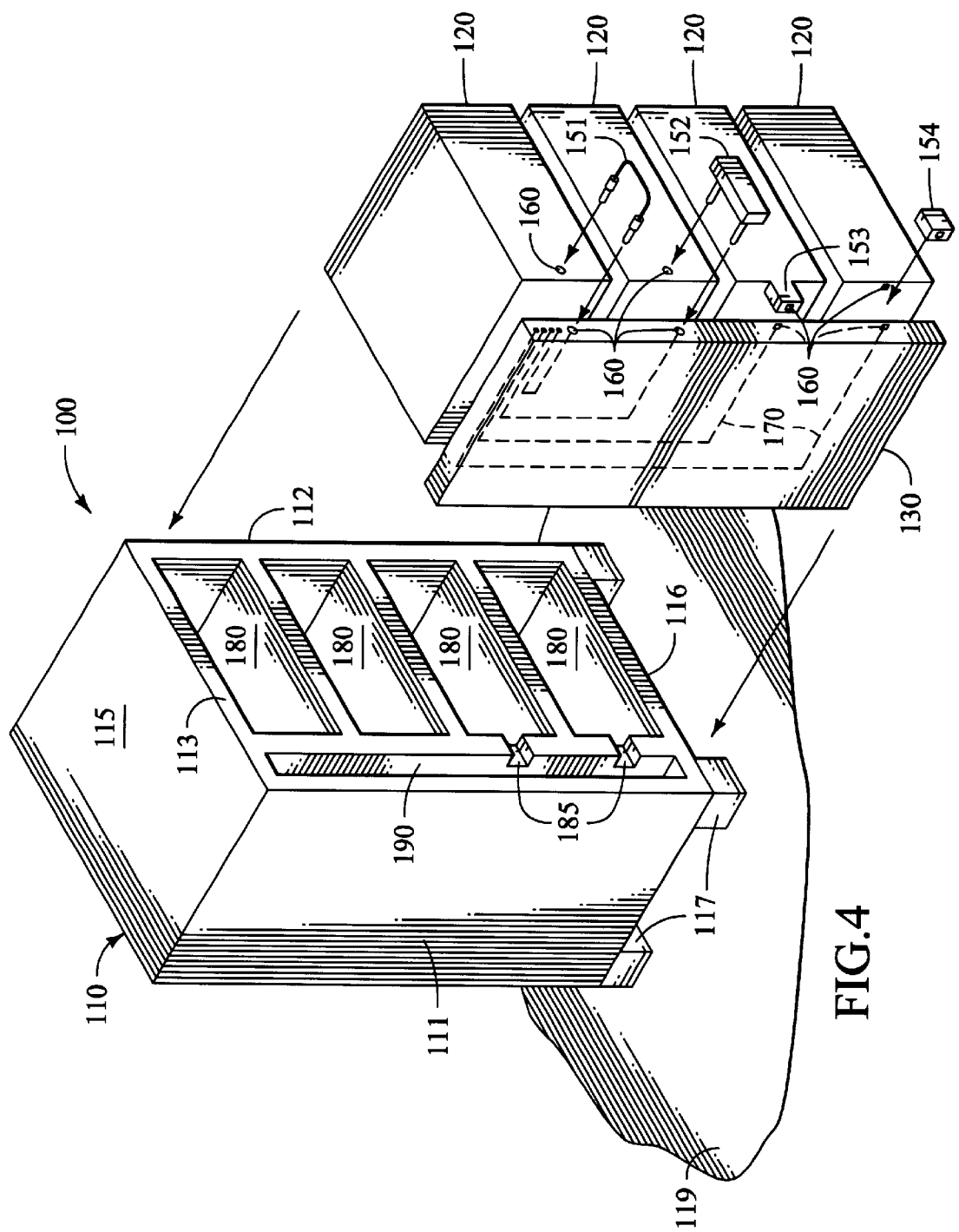
FIG. 4 is a perspective view of an apparatus in accordance with a first embodiment of the present invention.

Referring now to FIG. 4, a perspective view is shown of a one-plane embodiment of an apparatus 100. The apparatus 100 includes a support structure 110 such as, a frame, or chassis, which is generally configured to rest on a floor 119 or the like. However, although the support structure 110 is shown to be a stand-alone unit, it should be understood that the support structure can be configured so as to form an integral part of a larger structure, or the like (not shown). The support structure 110 can be configured to support a plane 130 and a plurality of modules 120. The plane 130 can provide routing to the modules 120. By "routing," we mean distribution of signals and/or power. Also, the plane 130 is generally configured as a support for at least one routing path 170 which, in the case electrical equipment, can be an electrical circuit as shown, or the like. The plane 130 can be connected to each of the modules 120 by way of one of a plurality of connectors 151, 152, 153, 154. The connectors 151, 152, 153, 154 as depicted herein as electrical connectors. However, it is understood that the connectors 151, 152, 153, 154 can be configured as fiber optic connectors (not shown) or the like. It is further understood that, for illustrative purposes, the connectors 151, 152, 153, 154 are depicted herein as primarily external to the support structure 110. However, the connectors 151, 152, 153, 154 can, in the alternative, be configured to be primarily internal (not shown) with respect to the support structure 110. The connectors 151, 152, 153, 154 can also, in the alternative, be configured substantially integral (not shown) to the support structure 110. By "connected," we mean connected so as to pass signals and/or power between the objects so connected. That is, "connected" can include electrically connected, optically connected, pneumatically connected, and hydraulically connected, among others. By "connectors," we mean devices, or configurations of devices, which facilitate the passage of signals and/or power between two or more objects which are connected.

It is understood that, for illustrative purposes, the various embodiments of the present invention which are described herein will be discussed primarily in terms of electrical equipment which is made up of various components, or modules, between which electrical signals and electrical power are routed. It is further understood that the invention can include other embodiments in accordance with the present invention, which are not specifically shown or described herein, and which other embodiments provide other forms of signal and power routing, including fiber optic, pneumatic, and hydraulic, etc.

Figure 6:
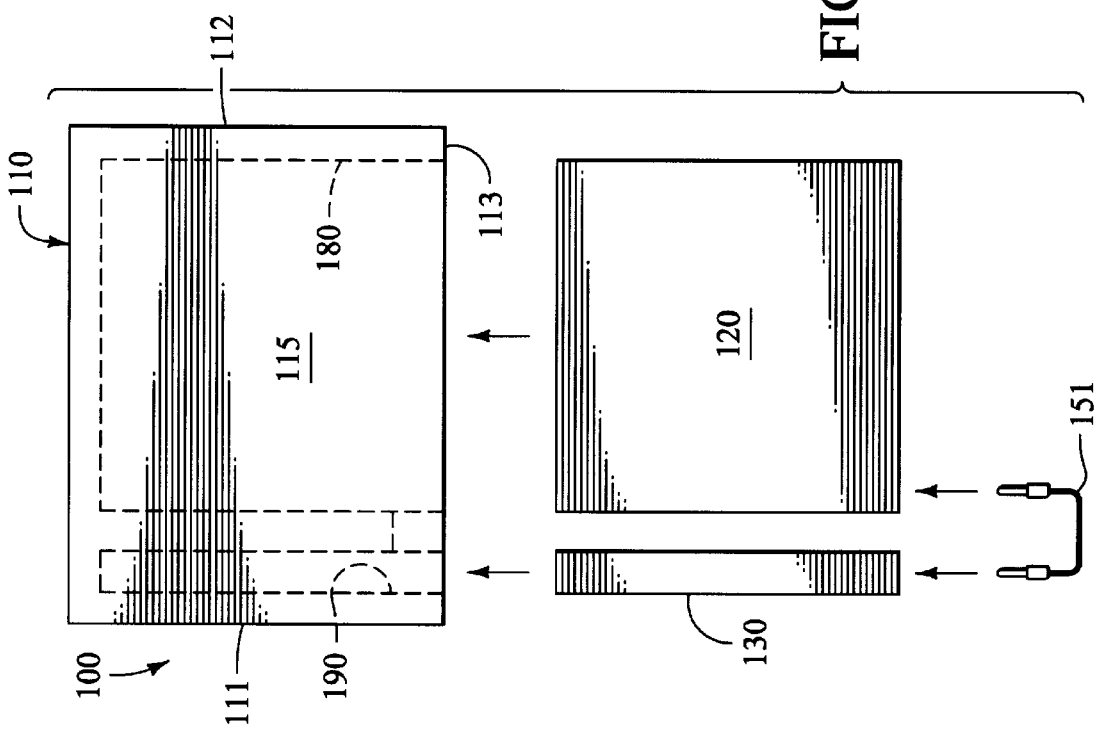
FIG. 6 is a top plan view of the apparatus shown in FIG. 4.
Figure 5:
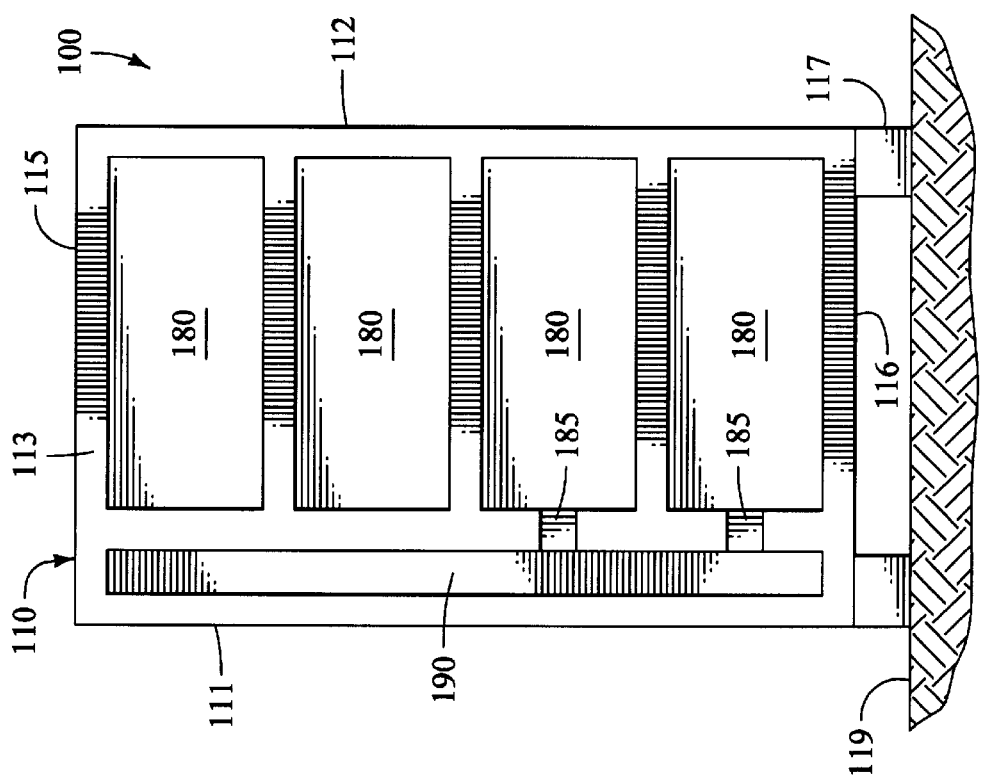
FIG. 5 is a front elevation view of the support structure of the apparatus shown in FIG. 4.

Moving to FIGS. 5 and 6, a front view of the support structure 110 is shown in FIG. 5 and a top view of the apparatus 100, including the support structure, the plane 130, a module 120 and connector 151 is shown in FIG. 6. The support structure 110 can have a first side 111 and an opposite second side 112 which can be substantially parallel to the first side as shown. The first side 111 and the second side 112 can be configured to be substantially flat as shown. The support 110 can also have a top 115 and an opposite bottom 116 which can be substantially parallel to the top as shown. Both the top 115 and the bottom 116 can be substantially flat as well. The top 115 and the bottom 116 can be attached to opposite ends of the first and second sides 111, 112 so as to form a box-like enclosure. Although the first and second sides 111, 112, and the top and bottom 115, 116, are depicted as being solid panels, or sheets, it should be understood that, in the alternative, the first side 111, second side 112, top 115, and bottom 116 can be configured so as to be substantially open so as to allow the passage of light and air there through.

As further shown, the support structure can have a set of legs 117, or the like, which are attached to the bottom 116 and which are configured to support the apparatus 100. As is evident, the first side 111, second side 112, top 115, and bottom 116, can each be substantially rectangular in shape. However, it is understood that the sides 111, 112 and top and bottom 115, 116 can have any geometric shape. Furthermore, it is understood that any particular shape of the support structure 110 is not to be implied herein. Also, as is evident, the first side 111 and second side 112 can be substantially perpendicular to both the top 115 and bottom 116.

FIGS. 5 and 6 also reveal that the first side 111, second side 1 12, top 115, and bottom 116 are depicted as terminating along a common edge so as to form an access face 113. By "access face" we mean a single side, or area, or the like, of the support structure 110 which is at least partially open so as to allow the passage of at least one module 120 or plane 130 there through. It is further evident that the access face 113 can be configured so as to be substantially flat, although it can alternatively be configured to have any contour. In addition, the access face 113 can be configured so as to be substantially perpendicular to the first side 111 and to the second side 112. The access face 113 can also be perpendicular to the top 115 and the bottom 116. Moreover, the access face 113 can be covered with a door, or removable panel, or the like (not shown). However, such a door, panel, or other protective covering is optional, as the access face 113 can be configured so as to remain uncovered.

The apparatus 100 also includes a plane receiver 190 and a plurality of module receivers 180 which are defined on the support structure. By "plane receiver" we mean a portion of the support structure 110 which is configured to receive, through the access face 113, and removably support a plane 130 in a given orientation on the support structure. By "module receiver" we mean a portion of the support structure 110 which is configured to receive, through the access face 113, and removably support a module 120 in a given orientation on the support structure. The module receivers 180 can be oriented substantially parallel to one another, and can also be oriented substantially inline, or in other words, in a substantially straight row as shown. Also, the plane receiver 190 can be oriented substantially parallel to each of the module receivers 180. At least one passageway 185 can be defined on the support structure 110 between the plane receiver 190 and at least one module receiver 180 as shown.

Turning back to FIG. 4, the support structure 110 is configured to receive and support a plurality of modules 120 in each of the module receivers 180. The support structure 110 is generally configured to removably support at least one such module 120, but can be configured to removably support any number of modules. By "removably support" we mean the modules 120 and the plane 130 can be selectively installed onto, and selectively removed from, the support structure 110 without requiring the support structure to be disassembled. The support structure 110 can be configured to slidably receive the plane 130 and each module 120 during installation into, and removal from, the support structure. By "slidably receive" we mean movement of the plane 130 or module 120 with respect to the support structure 110 which movement is similar to that of a drawer. In other words, during installation into the support structure 110, the plane 130 and each module 120 can slide into the plane receiver 190 and module receivers 180, respectively, so as to be guided onto the support structure. For illustrative purposes the apparatus 100 depicted herein is shown with a support structure 110 which can removably support four modules 120. However, it is understood that the support structure 110 can be configured to removably support any number of modules 120. The modules 120 can be components which are generally included in electronic equipment. For example, the modules 120 can be components such as, but not limited to, a disk drive, a controller, a power supply, or a cooling fan, etc.

The support structure 110 can also be configured to removably support a plane 130. The plane 130 can have at least one routing path 170, such as in the form of an electrical circuit as shown, to provide signal and/or power routing to each of the modules 120. Alternative configurations of the routing path 170 can include a network of fiber optic filaments (not shown), or the like. The plane 130 can be constructed in any of a number of possible configurations. For example, in the case of electrical equipment, the plane 130 can be in the form of a printed circuit board, or printed circuit assembly, or the like. It is understood that the routing paths 170 are depicted herein as simplified paths for illustrative purposes. It is further understood that the routing paths 170 can be configured in any number of possible manners. Furthermore, it is understood that the routing paths 170 can include devices other than simple paths. For example, in the case of a unit of electrical equipment, the routing paths can include any number of possible electrical and electronic components, and/or information handling components such as, transistors, capacitors, resistors, electronic memory devices and microprocessors, etc. As a further example, in the case of pneumatic equipment, or the like, the routing paths 170 can include valves, regulators, or the like.

Although the support structure 110 is depicted as configured to removably support a single plane 130, it is understood that the present invention can include a support structure which is configured to removably support any number of planes, as will be more fully discussed below. Further, while the plane, 130 is depicted as being located proximate to the first side 111 of the support structure 110, it is understood that the plane can equally well be located proximate to the second (or opposite) side 112 of the support structure. It is also understood that the plane 130 can equally well be located proximate the top 115 or the bottom 116 of the support structure 110. The plane 130 can be selectively connected to each of the modules 120 when the plane and modules have been installed onto the support structure 110.

In the case of a unit of electrical equipment, each of the modules 120 and planes 130 has at least one electrical contact 160. Preferably, the plane 130 can have at least one electrical contact 160 for each module 120. The connection between each of the contacts 160 on the plane 130 and the contacts 160 on each of the modules 120 can be facilitated by use of the connectors 151, 152, 153, 154. It is understood that connectors are known in the art and that numerous types of connectors are available. For illustrative purposes, four possible types of electrical connectors 151, 152, 153, 154 are depicted.

For example, one type of connector 151 which can be used is that of a separate, flexible connector, as shown. The contacts 160 which are associated with the connector 151 can be configured as sockets. The connector 151 can plug into one of the contacts 160 on the plane 130 and to one of the contacts 160 on at least one of the modules 120 so as to electrically connect the plane and module. Another type of connector 152 which can be used is a separate, rigid connector which is configured and used in a manner similar to that of the electrical connector 151 except that the connector 152 is substantially rigid rather than flexible.

A third type of connector 153 which can be used is one which is integral to the modules 120 and plane 130 as shown. As can be seen, the electrical contacts 160 which are associated with the connector 153 are located on the plane 130 and module 120 so as to face one another. The connector 153 can be configured to allow one of the contacts 160 on the plane 130 to come into direct contact with a contact 160 on one of the modules 120. When the plane 130 and modules 120 have been installed onto the support structure 110, the connector 153 can be supported in a passageway 185. A fourth type of connector 154 is a separate, rigid connector which is configured to be flush with the access face 113. The electrical contacts 160 which are associated with the fourth type of connector 154 are located on the plane 130 and module 120 so as to face one another. When the plane 130 and the modules 120 have been installed onto the support structure 110, the fourth type of connector 154 can be supported in a passageway 185. The separate connectors 151, 152, 154 can be removed from the apparatus 100 for repair or replacement while allowing the modules 120 and plane 130 to remain supported on the support structure. The integral connector 153 cannot be separated from the respective module 120, and thus, cannot be removed from the apparatus 100 without removal of the respective module 120.

It is evident that the plane 130 can be removably supported on the support structure 110 in a substantially parallel and juxtaposed relation to the first side 111. It can also be seen that the modules 120 can be removably supported on the support structure in a substantially straight row. As is also evident, the modules 120 can removably supported on the support structure 110 so as to be oriented in a row which is substantially parallel to the first side 111 and to the second side 112. In addition, the modules 120 can be removably supported on the support structure 110 so as to be oriented in a row which is substantially parallel to the plane 130. Although the plane 130 and the modules 120 are depicted in specific orientations with respect to one another, it is understood that the modules 120 and plane 130 can be oriented in any manner which allows the plane and each of the modules 120 to be individually installed onto, or removed from, the support structure 110 in any sequence as described.

It is further evident that the plane 130 and any of the modules 120 can be installed onto, or removed from, the support structure 110 through the access face 113 in any sequence. That is, the plane 130 can be installed onto, or removed from, the support structure 110 through the access face 113 without removing any of the modules 120 from the support structure. Likewise, any of the modules 120 can be installed onto, or removed from, the support structure 110 through the access face 113 without removing any of the other modules or the plane 130. Furthermore, it is evident that the plane and any of the modules 120 can be installed onto, or removed from, the support structure 110 without disassembly of the support structure. However, removal of either the plane 130 or any of the modules 120 from the support structure 110 requires that the plane and modules be electrically disconnected from one another. For example, some types of connectors 151, 152 can be unplugged or otherwise disconnected from either the plane 130, the module 120, or both the plane and the module before removal of either the plane or modules from the support structure. Other types of connectors 153, 154 do not require removal of the connector prior to removal of either the plane 130 or modules 120 from the support structure 110.

Figure 7:
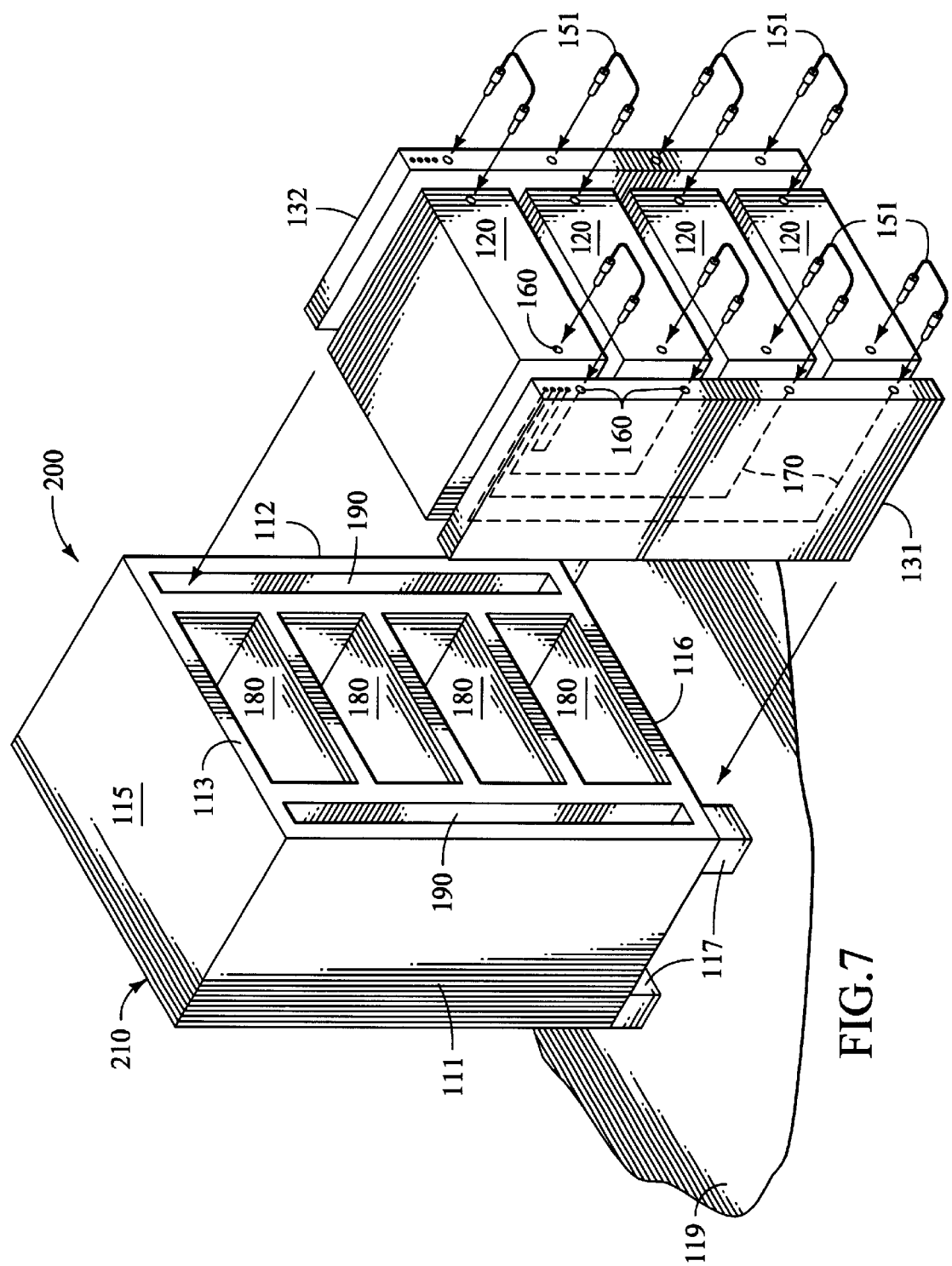
FIG. 7 is a perspective view of an apparatus in accordance with a second embodiment of the invention.

Moving to FIG. 7, a perspective view of a two-plane embodiment of the apparatus 200 is shown. The apparatus 200 includes a support structure 210 which can be configured in a manner similar to that of the support structure 110 which is depicted in FIGS. 4 through 6. The support structure 210 has a first side 111, an opposite second side 112, a top 115, and an opposite bottom 116. In addition, an access face 113 is defined on the support structure. The support structure can also have a set of legs 117 which can support the apparatus 200 on a floor 119. As is evident, the support structure 210 can be configured to removably support a first plane 131 and a second plane 132 in addition to a plurality of modules 120. Each of the modules 120 can be received into a plurality of module receivers 180 which are defined on the support structure 210. Likewise, the first plane 131 and the second plane 132 can be received into plane receivers 190 which are also defined on the support structure 210. As can be seen, the plane receivers 190 can be oriented on the support structure 210 in substantially parallel, spaced, juxtaposed relation to one another. Also, as shown, the module receivers 180 can be oriented on the support structure 210 so as to be substantially between the plane receivers 190.

As can be seen, the first and second planes 131, 132 can be removably supported on the support structure 210 so as to be oriented substantially parallel to one another. Also, the first plane 131 can be supported on the support structure 210 in parallel, juxtaposed relation to the first side 111. Likewise, the second plane 132 can be supported on the support structure 210 in parallel, juxtaposed relation to the second side 112. The access face 113 can be substantially flat as shown, and each of the first and second planes 131,132 can be removably supported on the support structure 210 so as to be substantially perpendicular to the access face. Also, the modules 120 can be supported on the support structure 110 between the first and second planes 131, 132.

Each of the first and second planes 131, 132 can have at least one routing path 170. The routing paths 170 have been explained above for FIGS. 4 through 6. Each of the first and second planes 131, 132 can be connected to at least one of the modules so as to provide signal and power routing to the modules. Connectors 151 can be used to connect the first and second planes 131, 132 to the modules 120. It is understood that connectors are known in the art and that any type of connector can be used with the invention so as to connect the planes 131, 132 with the modules 120. For example, the apparatus 200 can use any of the connectors 151, 152, 153, 154 which are depicted in FIG. 4. The configuration and use of the connectors 151, 152, 153, 154 has been explained above for FIGS. 4 through 6.

Additionally, the first plane 131 and second plane 132 can be connected to the modules 120 to provide redundant routing to the modules. It is evident that either of the first or second planes 131, 132 can be installed onto, or removed from, the support structure 210 through the access face 113 without requiring the removal of the other plane or any of the modules 120. Additionally, either of the first or second planes 131, can be installed into, or removed from, the support structure 110 through the access face 113 without requiring the disassembly of the support structure. Likewise, it is evident that any of the modules 120 can be installed into, or removed from, the support structure 110 through the access face 113 without requiring the removal of either of the first or second planes 131, 132, or the disassembly of the support structure. Similarly, any of the modules 120 can be installed onto, or removed from, the support structure 210 without removal of any other module.

It is evident that, because of the redundant configuration of the first and second planes 131, 132, the first plane 131 can be disconnected from the modules 120 and removed from the support structure 210 while leaving the second plane 132 connected to the modules and supported on the support structure without effecting the routing provided by the second plane 132 between the modules 120. Likewise, it is evident that the second plane 132 can be disconnected from the modules 120 and removed from the support structure 210 while leaving the first plane 131 connected to the modules and supported on the support structure without effecting the routing provided by the first plane 131. Any of the modules 120, and either of the first and second planes 131, 132, can be installed onto, or removed from, the support structure 210 in any sequence. That is, any of the modules 120 and either of the first and second planes 131, 132 can be removed from the support structure 210 without regard to either the position or the movement of any of the other modules or planes.

However, the removal of any of the modules 120 or planes 131, 132 from the support structure 210 requires that the respective module and plane be electrically disconnected prior to such removal. The disconnection of a module 120 and plane 131, 132 has been explained above. After disconnecting the respective module 120 and plane 131, 132, the module or plane can be removed from the support structure 210 by movement out of the respective module or plane receiver 180, 190 and through the access face 113. Conversely, any of the modules 120 or planes 131, 132 can be installed onto the support structure 210 by moving the module or plane through the access face 113 and into the respective module receiver 180, or plane receiver 190. After being installed onto the support structure 210, the respective module 120 and plane 131, 132 can be connected by way of the respective connector 151.

Figure 8:
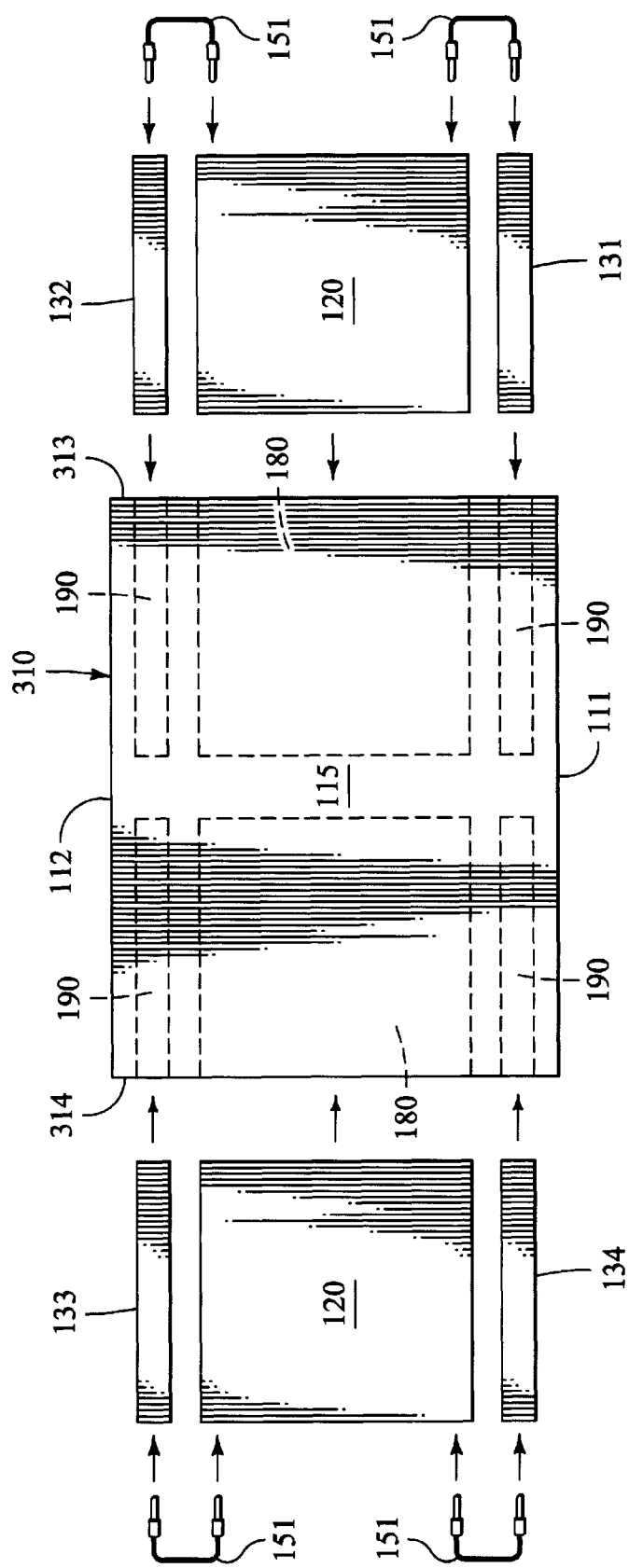
FIG. 8 is a top plan view of an apparatus in accordance with a third embodiment of the invention.

Turning now to FIG. 8, a third embodiment of an apparatus 300 in accordance with the present invention is shown. FIG. 8 depicts a top sectional view of an apparatus 300 which is similar to the apparatus 100 and 200 described above. However, the apparatus 300 provides a support structure 310 with a front access face 313 and a rear access face 314. The front and rear access faces 313, 314 can be substantially parallel to one another as shown. The front access face 313 can provide access to at least one module receiver 180 and at least one plane receiver 190. Likewise, the rear access face 314 can also provide access to at least one module receiver 180 and at least one plane receiver 190 as shown. As shown, the plane receivers 190 can be oriented substantially parallel to one another. The plane receivers 190 can also be oriented substantially parallel to the module receivers 180. The support structure 310 can be configured to removably support a first plane 131 and a second plane 132, through the front access face 313 in a manner similar to that described above for FIG. 7. The support structure 310 can also be configured to removably support a third plane 133 and a fourth plane 134 through the rear access face 314 in a manner similar to that described above for FIG. 7.

At least one module 120 can be removably supported on the support structure 310 through each of the front and rear access faces 313, 314 in a manner similar to that described above for FIG. 7. As depicted in FIG. 8, the module 120 can also be connected to the first and second planes 131, 132 by respective connectors 151 in a manner similar to that described above for FIG. 7. In like manner, the module 120 can be connected to the third and fourth planes 133,134 by way of connectors 151. As is apparent from the above description with respect to FIGS. 4 through 7, each of the four planes 131, 132, 133, 134 can be removed and installed through the respective access face 313, 314 without necessitating the removal of any module 120 or other plane. Likewise, because of the redundant routing provided by the planes 131, 132, 133, 134 it is evident that either of the first and second planes 131, 132, and either of the third and fourth planes 133, 134 can be removed without effecting the routing provided to any module 120.

Figure 9:
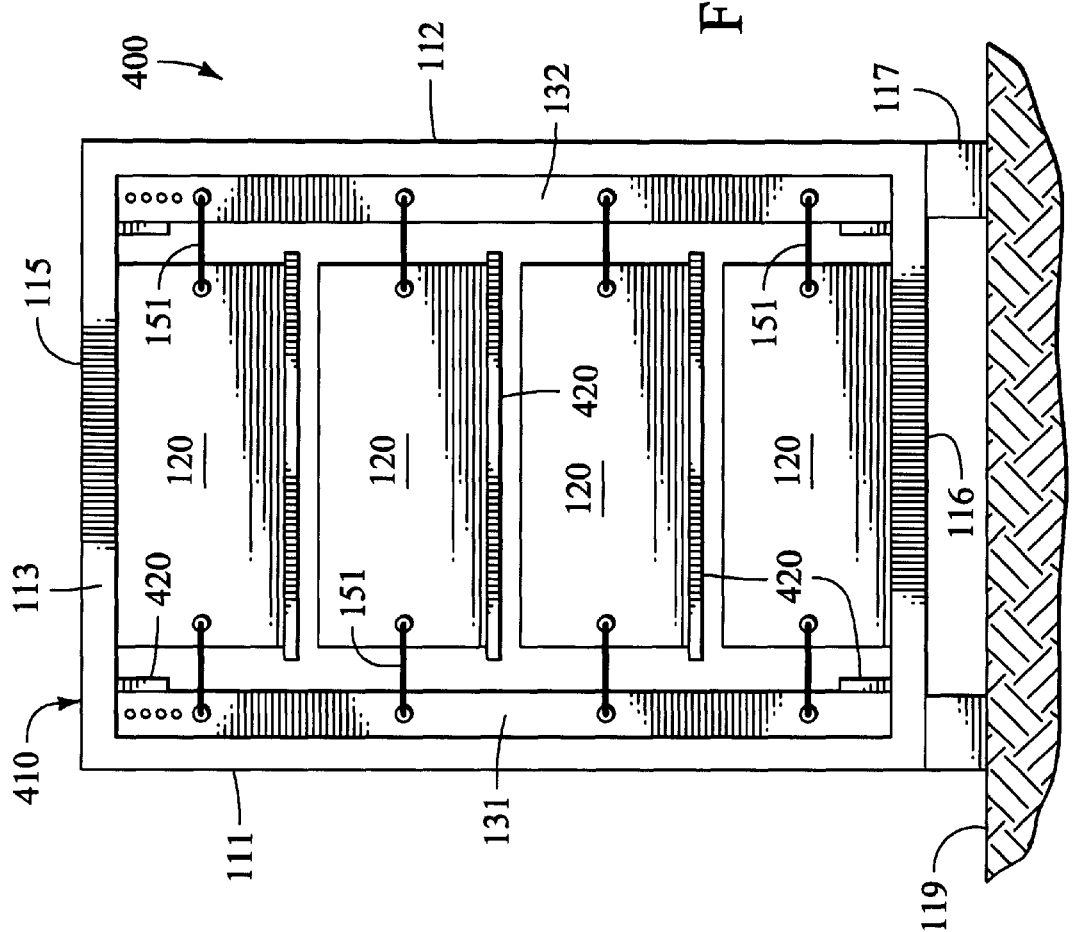
FIG. 9 is a front elevation view of an apparatus in accordance with a fourth embodiment of the invention.

Moving to FIG. 9, a fourth embodiment of an apparatus 400 in accordance with the present invention is shown. FIG. 9 depicts a front elevation view of an apparatus 400 which is similar to the apparatus 100 and 200 described above. The apparatus 400 provides a support structure 410 with a first side 111, a second side 112, a top 115, and a bottom 116 which define an access face 113. The apparatus 400 also can have a set of legs 117 which can support the apparatus on a floor 119. The apparatus 400 also can have, defined in the support structure 410 between the first and second sides 111, 112 and between the top 115 and the bottom 116, a receiver 195 which is configured to removably support at least one module 120 and a least a first plane 131 as shown. The receiver 195 can be configured to removably support a second plane 132 as well. Each of the first and second planes 131, 132 can be connected to the modules 120 by way of connectors 151 in a manner similar to that described for FIGS. 4 through 7.

The apparatus 400 can also have at least one stabilizer 420 connected to the support structure 410. Each stabilizer 420 can serve to stabilize the position of a plane 131, 132 or a module 120 while removably supported within the receiver 195. As is apparent from the above discussion with respect to FIGS. 4 through 7, each of the first and second planes 131, 132, as well as each module 120, can be installed onto, and removed from, the support structure 410 through the access face 113 in an individual manner and without necessitating the removal of any other module or plane or the disassembly of the support structure.

In accordance with yet another embodiment of the present invention, the invention includes a method of providing routing in a unit of equipment, such as an electrical device, which includes a plurality of sub-component modules. The method includes the step of providing a structural support which can be configured to support a plurality of modules and at least one plane which is configured to provide routing to the modules. The modules are placed on the support structure and subsequently the plane is placed on the support structure. The plane is connected to the modules to provide routing between the modules and the plane. The method can include the additional steps of placing a second plane on the support and connecting the second plane to the modules to provide redundant routing to the modules.

In accordance with another embodiment of the invention, the invention includes a method of providing routing in a unit of equipment, and wherein the method includes providing a support structure defining an access face. The method also includes placing a plurality of modules on the support structure by movement of the plurality of modules through the access face. A first plane is placed on the support structure by movement of the first plane through the access face such that removal of any of the modules from the support structure and through the access face does not require removal of the first plane. A second plane is placed on the support structure by movement of the second plane through the access face such that removal of any of the modules, or first plane, from the support structure and through the access face does not require removal of the second plane. The second plane is connected to the modules to provide redundant routing to the modules.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for supporting a removable plane and at least one removable module, comprising:
   a support structure configured to support the plane and the modules in a removable manner;
   an access face defined on the support structure; and,
   wherein the support structure is configured to allow the plane and the modules to be placed onto, and removed from, the support structure individually and in any sequence.

2. The apparatus of claim 1, and wherein the support structure supports the modules in a substantially parallel orientation to one another.

3. The apparatus of claim 1, and wherein:
   the support structure has a first side and an opposite second side which is substantially parallel to the first side;
   the first side and the second side are substantially perpendicular to the access face; and,
   the support structure is configured to support the plane in substantially parallel, juxtaposed relation to the first side.

4. The apparatus of claim 1 and wherein:
   the access face is substantially flat; and,
   the support structure is configured to support the plane in a substantially perpendicular orientation to the access face.

5. The apparatus of claim 1, and further comprising:
   a plane receiver defined on the support structure; and,
   a plurality of module receivers defined on the support structure.

6. The apparatus of claim 3, and wherein the access face is substantially flat.

7. The apparatus of claim 3, and wherein the support structure is configured to slidably receive the plane.

8. The apparatus of claim 3, and wherein the support structure is configured to support the modules in a row which is substantially parallel to the first and second sides.

9. The apparatus of claim 8, and wherein the support structure is configured to support the plane in a substantially parallel orientation to the row of modules.

10. An apparatus for supporting a plurality of removable electronic modules comprising:
    a support structure configured to support the plurality of electronic modules in a removable manner;
    a first plane removably supported on the support;
    a second plane removably supported on the support; and,
    wherein the first and second planes are each configured to be electrically connected to at least one of the modules while the modules are supported on the support structure.

11. The apparatus of claim 10, and wherein the first and second planes are configured to provide redundant electrical routing between the modules.

12. The apparatus of claim 10, and further comprising at least two plane receivers defined on the support structure, and wherein each plane receiver is configured to slidably receive and support one each of the first and second planes.

13. The apparatus of claim 11, and further comprising a plurality of module receivers defined on the support structure, and wherein each module receiver is configured to slidably receive and support at least one module.

14. The apparatus of claim 13, and wherein the module receivers are oriented substantially in-line.

15. The apparatus of claim 14, and wherein:
    at least two of the plane receivers are oriented in substantially parallel, spaced, juxtaposed relation to one another; and,
    the modules receivers are oriented substantially between the plane receivers.

16. A method of providing electrical routing in an electronic device, comprising:
    providing a support structure which defines a substantially open access face;
    placing a plurality of modules on the support structure by movement of the plurality of modules through the access face;

placing a first plane on the support structure by movement of the first plane through the access face such that the first plane is removable from the support structure through the access face without requiring removal of any of the plurality of modules; and, electrically connecting the first plane to the plurality of modules to provide electrical routing between the plurality of modules.

17. The method of claim 16, and further comprising:

placing a second plane on the support structure by movement of the second plane through the access face such that the plurality of modules and the first plane are removable from the support structure through the access face without removal of the second plane; and, electrically connecting the second plane to the plurality of modules to provide redundant electrical routing between the plurality of modules.

18. The method of claim 17, and further comprising:

electrically disconnecting the first plane from the plurality of modules; and, removing the first plane from the support structure through the access face.

* * * * *